(12) United States Patent
Mak et al.

(10) Patent No.: US 7,132,374 B2
(45) Date of Patent: Nov. 7, 2006

(54) METHOD FOR DEPOSITING POROUS FILMS

(75) Inventors: Cecilia Y. Mak, 5502 Sunset Hills Ct., San Jose, CA (US) 95138; Kam S. Law, 5502 Sunset Hills Ct., San Jose, CA (US) 95138

(73) Assignees: Cecilia Y. Mak, San Jose, CA (US); Kam S. Law, San Jose, CA (US)

( * ) Notice: Subject to any disclaimer, the term of this patent is extended or adjusted under 35 U.S.C. 154(b) by 0 days.

(21) Appl. No.: 10/920,602

(22) Filed: Aug. 17, 2004

(65) Prior Publication Data
US 2006/0040507 A1 Feb. 23, 2006

(51) Int. Cl.
*H01L 21/31* (2006.01)
*H01L 21/469* (2006.01)

(52) U.S. Cl. .............................. 438/784; 257/E21.581; 438/790

(58) Field of Classification Search ................ 438/758, 438/781, 784, 790; 257/E21.581, E21.576
See application file for complete search history.

(56) References Cited

U.S. PATENT DOCUMENTS

| | | | |
|---|---|---|---|
| 6,007,675 A | 12/1999 | Toshima | |
| 6,054,206 A | 4/2000 | Mountsier | |
| 6,171,945 B1 | 1/2001 | Mandal et al. | |
| 6,271,273 B1 | 8/2001 | You et al. | |
| 6,451,712 B1 | 9/2002 | Dalton et al. | |
| 6,737,365 B1 | 5/2004 | Kloster et al. | |
| 2002/0132101 A1* | 9/2002 | Fonash et al. | 428/304.4 |
| 2003/0232137 A1* | 12/2003 | Vrtis et al. | 427/248.1 |
| 2004/0026783 A1* | 2/2004 | Kloster et al. | 257/758 |
| 2004/0061201 A1* | 4/2004 | Andideh | 257/635 |
| 2004/0096593 A1 | 5/2004 | Lukas et al. | |
| 2004/0096672 A1 | 5/2004 | Lukas et al. | |

OTHER PUBLICATIONS

Maex, K. et al., *Low Dielectric Constant Materials for Microelectrics*, Journal of Applied Physics, Jun. 1, 2003, pp. 8793-8841, vol. 93, No. 11, American Institute of Physics.
Wolf, S. *Silicon Processing for the VLSI ERA*; Deep-Submicron Process Technology, 2002, pp. 639-670, vol. 4, Lattice Press, Sunset Beach, California.
International Search Report dated Dec. 21, 2005 in PCT/US05/29281.

* cited by examiner

*Primary Examiner*—Caridad Everhart
(74) *Attorney, Agent, or Firm*—Bingham McCutchen LLP

(57) ABSTRACT

A processing method for depositing porous silica and doped silica films is provided. The method uses a cyclic scheme wherein each cycle comprises first codepositing silica with silicon, then selectively removing the silicon to form a porous structure. In a preferred embodiment, the codeposition is carried out by plasma enhanced chemical vapor deposition. The reagent feed stream comprises a mixture of codeposition reagents and a selective silicon removal reagent. RF power modulation is used to control the codeposition and the selective silicon removal steps with the later proceeds whenever the RF power is turned off or reduced to a low level. A porous film with highly uniform small pores and a desired porosity profile can be obtained with this method. This method is advantageous for forming a broad range of low-k dielectrics for semiconductor integrated circuit fabrication. The method is also advantageous for forming other porous films for other applications.

76 Claims, 9 Drawing Sheets

METHOD FOR DEPOSITING POROUS FILMS

BACKGROUND OF THE INVENTION

1. Field of Invention

The present invention relates generally to a processing method for depositing porous films on a substrate. More specifically, the present invention relates to a processing method for depositing porous silica or doped silica films for fabricating semiconductor integrated circuits. The method is also advantageous for use in other applications where porous structures are required.

2. Description of Related Art

Traditionally, silicon dioxide, having a dielectric constant (k) about 4, is used as the insulator material for fabricating semiconductor integrated circuits. As device dimensions shrink, interconnect RC (resistance-capacitance) delay issues require the insulator to have a lower dielectric constant in order to deliver superior circuit performance. The semiconductor industry has identified these targets at various technology nodes and published them on the International Technology Roadmap for Semiconductors. Dielectric constant less than 4 is commonly referred to as low-k and that less than 2.2 is commonly referred to as ultralow-k. It is projected that beyond the 90 nm device generation, low-k dielectrics having a k-value below 2.6 is desirable for device fabrication.

The dielectric constant is a measure of the tendency of a material to allow an externally applied electric field to induce electric dipoles in the material. This so-called electric polarizability is governed by the electronic, ionic and distortion polarization in the material. A good review of the polarization phenomena and a more detailed description of the various classifications of low dielectric constant materials can be found in the article by K. Maex et al. [K. Maex, M. R. Baklanov, D. Shamiryan, F. Iacopi, S. H. Brongersma, and Z. S. Yanovitskaya, J. App. Phys., Vol. 93, No. 11, p. 8793–8841] or the chapter by S. Wolf ["Silicon Processing for The VLSI Era, Volume 4: Deep-Submicron Process Technology" by S. Wolf, Lattice Press, Sunset Beach, Calif., 2002, p. 639–670].

Fundamentally, to weaken the polarization in silicon dioxide, one can alter the structural lattice of silicon and oxygen, replace some or all of the silicon-oxygen bonds with less polarized bonds, and/or introduce free space to decrease material density in the film. Explored efforts include developing 1) silica-based doped oxides, 2) silsesquioxane-based inorganic-organic hybrid polymers, 3) organic polymers, and 4) amorphous carbon films.

Silica-based doped oxides are usually deposited by chemical vapor deposition (CVD) methods with or without plasma enhancement. Fluorine doping provides fluorosilicate glass (FSG) with a k-value about 3.6. Carbon or other alkyl substitution reduce the dielectric constant further; some reaching k-values as low as 2.6 to 2.8. An altogether amorphous carbon film or a fluorocarbon film has been reported to yield lower k-values. However, amorphous carbon technology is still very immature and for now is not ready for manufacturing considerations.

CVD silica-based doped oxides are appealing for use as semiconductor dielectrics due to their silicon-oxide like structure. The films require almost no modification in circuit designs. Semiconductor manufacturers can also leverage existing toolsets and infrastructures to continue their device fabrication. Some of these films have been adopted at the 180 nm, 150 nm, 130 nm, and even 90 nm nodes. However, the oxycarbide films are prone to carbon depletion in subsequent processing, resulting in a less than desired final dielectric constant. Furthermore, the incorporation of carbon in silica introduces many process complications, particularly in etching, chemical mechanical polishing, and cleaning. Consequently, implementation has been formidable and costly.

In contrast, silsesquioxane-based inorganic-organic hybrid polymers and organic polymers are inherently low-k dielectrics due to their more opened molecular lattice than silicon dioxide and less polarized bonds in the molecular components. These materials can provide a broad range of low k values. These films are usually applied by spin coating, although some can also be deposited by CVD methods. The spun film must go through curing to drive off excess solvent, complete the chemical reactions, and undergo densification. Compared to silicon dioxide, these films are generally mechanically softer and less thermally stable. They also tend to take up moisture so additional cap layers are often required to protect them. Because of the different properties, there are many restrictions in conventional processing and modifications are frequently needed to accommodate these films in process integration. Therefore, widespread adoption has not been noted.

Recently, the industry has come to conclude that there is no fully dense spin-on or CVD material that has a low enough dielectric constant and at the same time satisfy all the diverse requirements for robust integration for the 90 nm generation and beyond. Since the dielectric constant scales proportionally with the host matrix density, attention has been turned to exploring the viability of reducing the dielectric constant by introducing porosity in the insulator.

Sol-gel techniques are known to provide a flexible means for incorporating dopants and forming a porous template in silica networks. Sol-gel techniques, however, require meticulous gellation and drying. Their different modes of processing, process control, and integration schedules are incompatible with semiconductor device manufacturing. Many of these films also exhibit deterioration of mechanical properties with decreasing k-values.

A more adaptable approach to introduce void volume in the dielectrics has been the use of sacrificial porogens [see for example, U.S. Pat. No. 6,271,273 and U.S. Pat. No. 6,451,712]. A thermally unstable material, referred to as the porogen, is blended with an organosilicate polymer and applied to form a film as in conventional spin-on dielectrics. The film is cured, then subject to an annealing step to volatize the porogen while forming a skeletal porous framework of the cured film. Critical to this thermolytic technique are: First, the porogen must separate from the thermosetting matrix and must decompose as well as removed entirely during the annealing step without leaving behind any residue. Second, the porogen decomposition must take place below the host's glass transition temperature without bringing about any collapse of the porous structure. Third, change in film stress must be carefully managed during phase separation and thermal expulsion of porogens without causing any film cracking or delamination. Porous films formed with this method usually have a broad pore size distribution with the smallest pores in the 20 nm range.

The porogen concept has also been explored with CVD techniques [see for example, U.S. Pat. No. 6,054,206 and U.S. Pat. No. 6,171,945]. Thermally unstable labile organic groups are deposited in organosilicate glass. The film is then annealed to volatize the labile organic components, resulting in a porous structure. An alternative e-beam treatment [see for example, U.S. Pat. No. 6,737,365] or ultraviolet exposure [see for example, U.S. Pat. App. 20040096672] has also been reported to be effective in removing these species and additionally enhance cross-linking of the host material. In general, nanoporous films with pores commensurate in size of the departing organic groups are obtained with this approach. The nanoporous matrix is claimed to provide good mechanical and thermal stability in subsequent processing. However, like other porogen techniques, this CVD technique is based on volatilizing organic species, and there are concerns for residual outgassing if the organic species that are supposed to be removed are not removed entirely. Moreover, process integration complications associated with processing carbon-containing oxide films still remain, as discussed earlier.

To date, development of low-k films continues. The object of this invention is to create a CVD process method for generating a porous low-k dielectric film that is extendable to the ultralow-k range. It is desirable that the film is chemically, mechanically, and thermally stable, similar to that of silicon dioxide. It is further desirable that process integration requirements are not excessive and costly when compared to established techniques.

BRIEF SUMMARY OF THE INVENTION

The present invention is generally directed to forming porous films. More specifically, the present invention is directed to forming porous silica or doped silica films on a substrate for fabricating semiconductor integrated circuit. The disclosed method uses a cyclic process scheme to deposit the film. In each cycle, a thin layer of silica and silicon or doped silica and silicon is first codeposited. (The codeposited film may be commonly viewed as a silicon-rich oxide or silicon-rich doped oxide). Then, the film is exposed to a chemical reagent that can preferentially remove silicon over silica in the codeposit, leaving behind a porous structure. The processing steps are repeated alternately to build up the thickness of the film.

The pore size and pore distribution in each layer are determined by the amount of sacrificial silicon incorporated and how the silicon is dispersed in that layer. Each subsequent deposition step puts down a layer of codeposit on the previously created porous layer and the following selective silicon removal step develops the porous structure in-situ. Hence, by means of the cyclic method disclosed in this invention, a desired porosity profile can advantageously be obtained in the silica film by tailoring the processing conditions at each cycle.

There are three salient features in this invention: 1) the codeposition of the silica (or the host matrix material in general) with silicon, 2) the exposure of the codeposit film to a selective silicon removal reagent during the silicon removal step, and 3) a methodology to facilitate and optimally control the codeposition and selective silicon removal steps.

As an embodiment of this invention, the selective silicon removal reagent is advantageously selected from a group of molecular halides or halogenated species comprising fluorine, chlorine, bromine and their derivatives thereof. The selective silicon removal reagent can also be a vapor derived from a solution containing potassium hydroxide, or tetramethylammonium hydroxide (TMAH), or ethylene diamine pyrocatecol (EDP), or their like or derivatives thereof, optionally mixed with a high vapor pressure carrier gas such as an alcohol that do not react with the vapor.

As a further embodiment of this invention, the preferred reagent to facilitate the selective silicon removal reaction is selected from the group consisting of molecular fluorine, xenon difluoride, and their combinations thereof.

In a preferred implementation of this invention, the deposition step is carried out by plasma enhanced chemical vapor deposition (PECVD) techniques. The reagent stream comprises a codeposition mixture that comprises at least one silicon-containing precursor and other additional chemical reagents known to those skilled in the arts for facilitating PECVD of silica and silicon or doped silica and silicon, and at least one selective silicon removal reagent.

In the preferred method, RF power modulation is used to facilitate the cyclic process of codeposition and selective silicon removal. When the RF power is at an optimal level for deposition of silica and silicon, deposition of the materials proceed. When the RF power is turned off or reduced to a low value, no dissociation occurs, whether dissociation leading to codeposition or dissociation of the silicon removal reagent. At this time, by means of the chemical actions of the silicon removal reagent, silicon is preferentially removed from the codeposit, leaving behind a porous silica structure.

The porous silica film obtained with this method has uniformly dispersed small size pores, commensurate with the uniformity and distribution of silicon dispersed in the codeposit. The pore size and porosity profile in the film is determined by the reactor chamber design, flow rates of the components in the reagent mixture, deposition conditions such as temperature, pressure, RF power, electrode spacing, and parameters relating to how the cyclic process is conducted such as the process cycle frequency and the duty cycle.

Other embodiments of the invention are disclosed in the claims. The present invention is generally applicable also for forming a porous doped silica film provided that the dopant constituents do not react with the selective silicon removal reagent significantly, or should it react, the residual reaction products are benign or desirable for enhancing the properties of the film. Likewise, the dopants are incorporated into the silica during the codeposition. The invention is further generally applicable for forming porous films of any host matrix material that can codeposit with silicon and is relatively chemically inert to the selective silicon removal reagent.

The process method described herein provides a means to obtain a porous low-k dielectric film for fabricating semiconductor integrated circuits. The method is also advantageous for fabricating other porous structures for other applications in fields including, but not limiting to, semiconductor, advanced packaging, energy storage, and advanced Microsystems.

BRIEF DESCRIPTION OF THE DRAWINGS

The teachings of the present invention can be readily understood by considering the detailed description in conjunction with the accompanying drawings, in which.

DETAILED DESCRIPTION OF THE INVENTION

The present invention provides a process method for forming porous silica or doped silica films on a substrate for semiconductor integrated circuits fabrication. The method is also generally applicable for forming porous films of other host matrix materials using the features described in the disclosure. For simplicity in discussion, we shall focus the description primarily on porous silica films.

According to the invention, the method entails a cyclic process scheme to form the film. In each cycle, a thin layer of silica and silicon or doped silica and silicon are first codeposited. (The codeposited film may be commonly viewed as a silicon-rich oxide or silicon-rich doped oxide). Then, the silicon is selectively removed from the codeposit to create a porous silica structure. The processing steps are repeated alternately to build up the thickness of the film. In this description, the conditions and implementation of the invention are further detailed.

For clarity, we shall refer herein "silicon" in the film as any loosely bonded silicon to silica, such as interstitial silicon or silicon bonded with hydrogen or hydroxyl, or any silicon covalently bonded to silicon, or elemental silicon, that is incorporated in the film during the codeposition. We shall refer "silica" in the film as any oxidized silicon that contains silicon fully or partially bonded to oxygen. In addition, the term "silica" is used interchangeably to refer to all types of oxidized silicon, undoped or doped with other constituents, unless otherwise stated. Silicon-rich oxide is regarded as a codeposit of silica and silicon. The term "host matrix" refers to the solid matter of a porous structure and "host matrix material" refers to the material that made up the porous structure.

Figure 1:
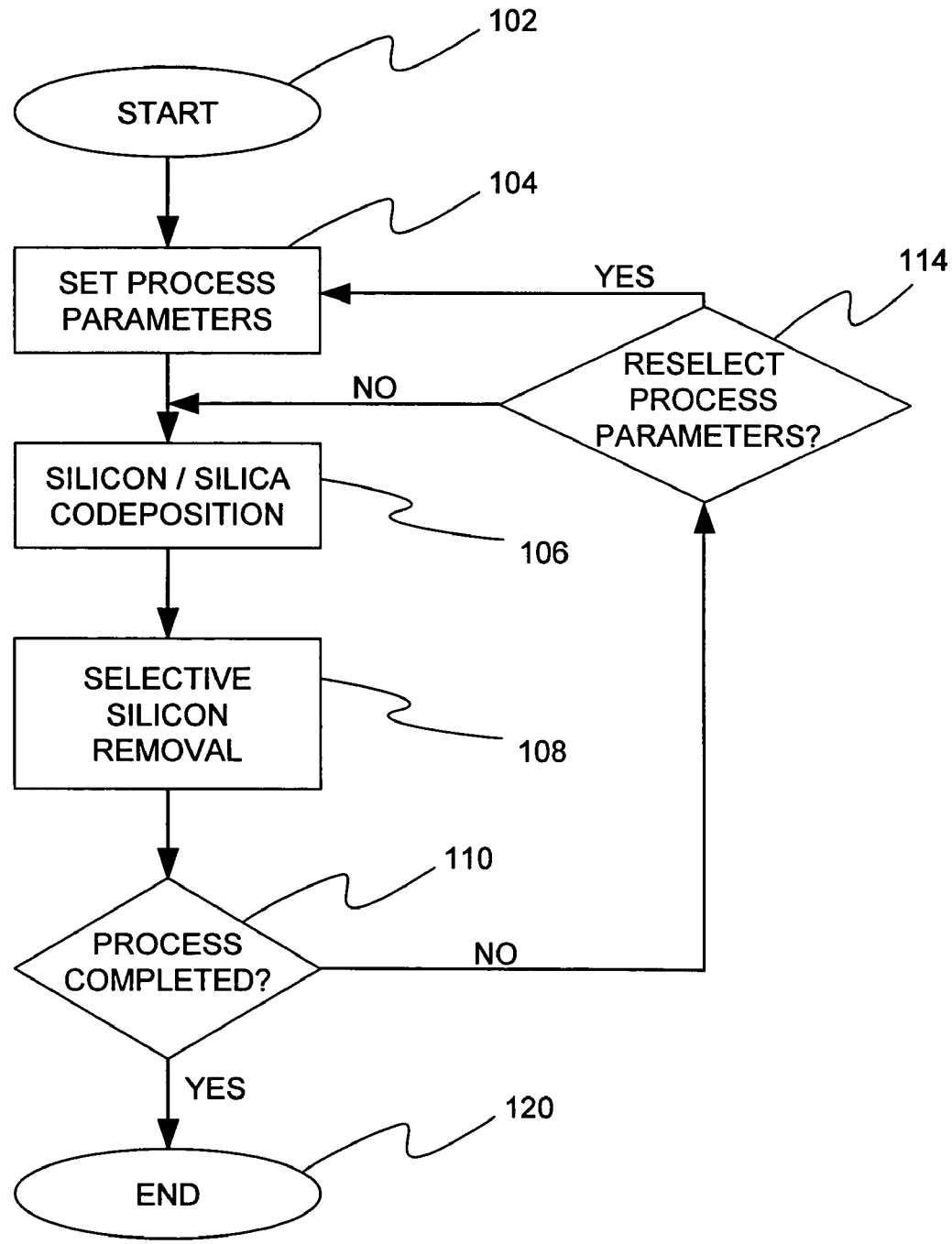
FIG. 1 is a flow diagram illustrating the sequential alternating steps of silica-silicon codeposition followed by selective removal of the silicon in the codeposit layer to form a porous silica film. After each cycle, the process conditions can be changed to tailor the porosity profile development in the film.

FIG. 1 shows a simplified flow diagram of the cyclic process and FIGS. 2A to 2I are schematic cross-sectional views of the processed film at different stages of film formation. These cross-sectional representations are simplified for illustrative purposes only and should not be taken as actual arrangement of the constituents in the codeposit film.

Figure 2A:
FIGS. 2A to 2I schematically illustrate the development of an exemplary porous film according to the cyclic codeposition and selective silicon removal process in this invention.
Figure 2B:
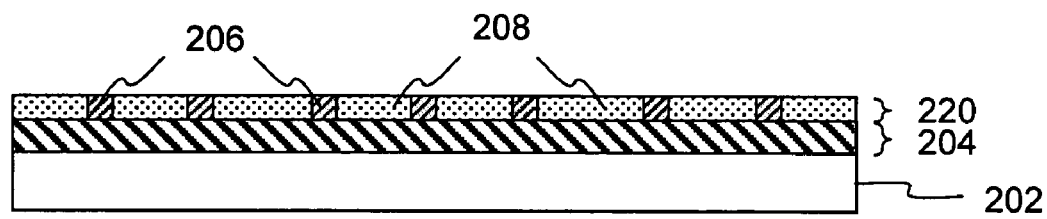

The process starts at step 102 with a substrate in the reaction chamber. In FIG. 2A, the starting substrate is illustrated as a silicon wafer 202 that have undergone some previous processing. The result from previous processing is schematically represented by a combined structure 204 on the silicon wafer. The surface of 204 is typical starting surface for processed wafers entering the stage of low-k dielectric deposition in semiconductor device fabrication. The surface 204 can alternatively be anything for other applications, including the bare surface of a silicon wafer.

At step 104, initial process parameters are set to codeposit a thin layer of silica and silicon. At step 106, deposition is conducted and produces a codeposit film 220 that comprises dispersed silicon 206 in silica 208. This is shown schematically in FIG. 2B.

Figure 2C:
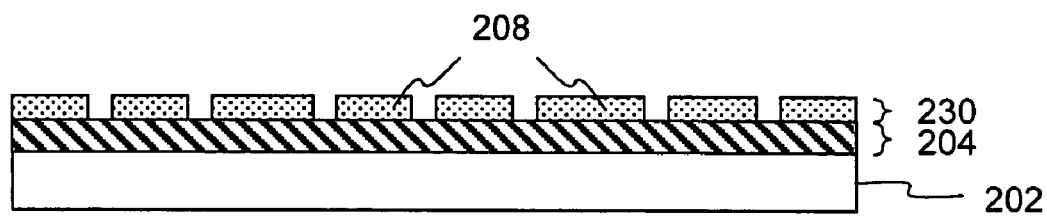

In the next step 108, silicon 206 is selectively removed from the codeposit 220. FIG. 2C shows a represented cross-section of the opened silica matrix 230 with only silica 208 remaining.

Figure 2D:
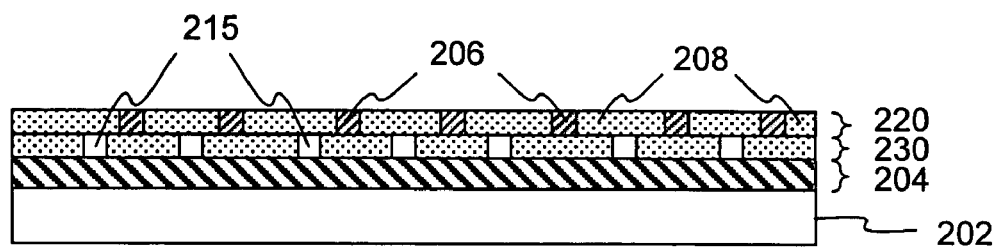
Figure 2E:
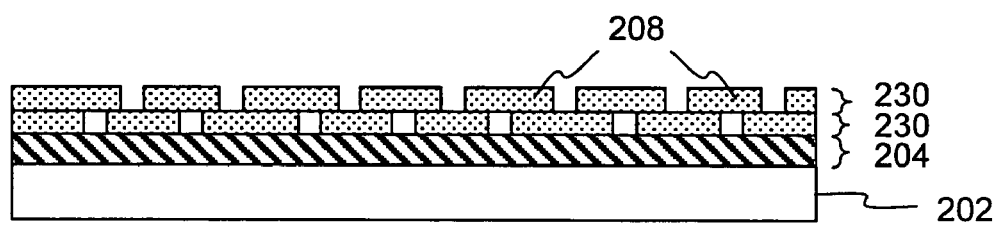
Figure 2F:
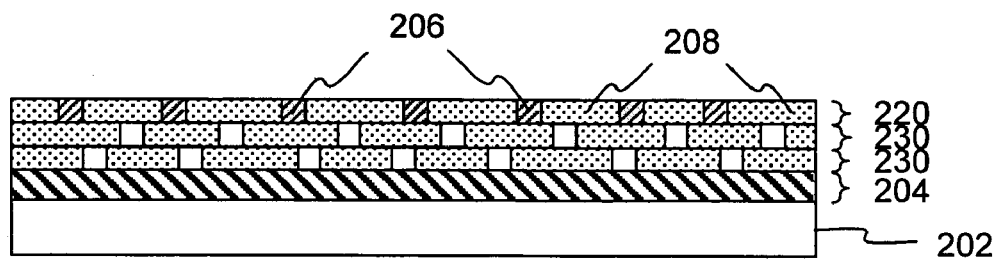
Figure 2G:
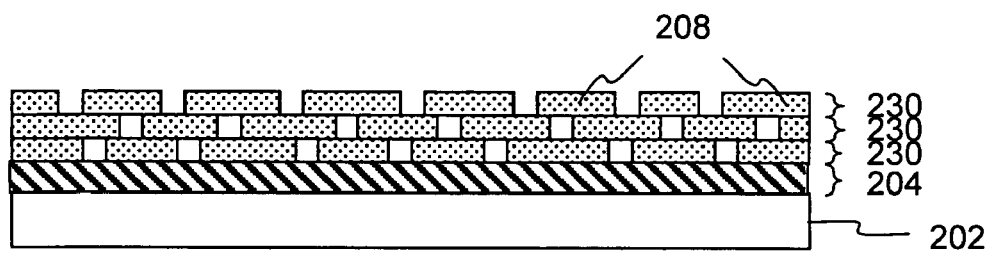
Figure 2H:
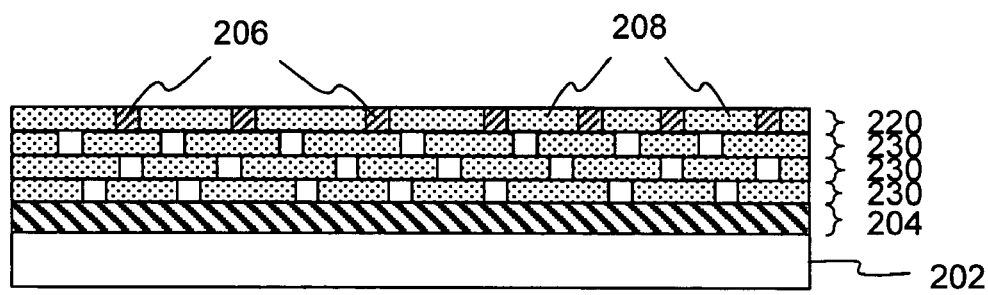
Figure 2I:
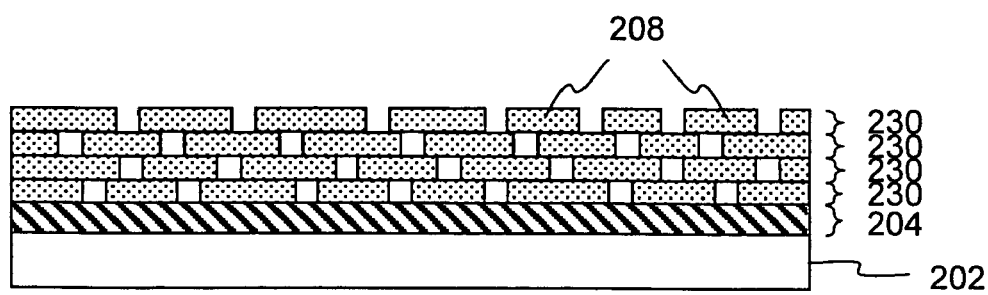

Usually more than one cycle is required to form the desired film thickness, so step 106 and 108 are repeated sequentially in the next cycle. By step 106 in the next cycle, the same codeposited layer 220 forms atop the previously created opened silica matrix layer 230, enclosing the opened spaces to form pores 215, as shown in FIG. 2D. FIG. 2E shows that after the subsequent selective removal step 108, the silicon 206 in the codeposit 220 is removed. The repeated deposition and selective removal steps now form a thicker porous silica film.

Step 110 in FIG. 1 determines if the desired film thickness has been achieved. If not, the same sequence of codeposition and selective silicon removal steps are repeated to build up the thickness of the porous film. FIGS. 2A to 2I shows illustratively the result from completion of four cycles. Many more cycles can be repeated as desired. The process ends in step 120.

The pore size and pore distribution in each layer is determined by the dispersion of silicon in the codeposit and the amounts of sacrificial silicon incorporated. In light of this characteristic, the cyclic process is also flexible for obtaining a porous film with a varied porosity profile. FIGS. 3A to 3I illustrates schematically a varied porosity film that can be obtained on the same starting surface 204. Layer 238 is schematically shown to contain less silicon than Layer 220 and after the silicon removal step 108, Layer 238 will form a porous layer 240 that is less porous than Layer 230. As a note, the porosity profile depicted in FIGS. 3A to 3I is intended for illustrative purposes only and does not limit the various profiles that can be obtained with this invention.

Figure 3A:
FIGS. 3A to 3I schematically illustrate the development of an exemplary porous film with a varied porosity profile that can be obtained with the cyclic process of this invention.
Figure 3B:
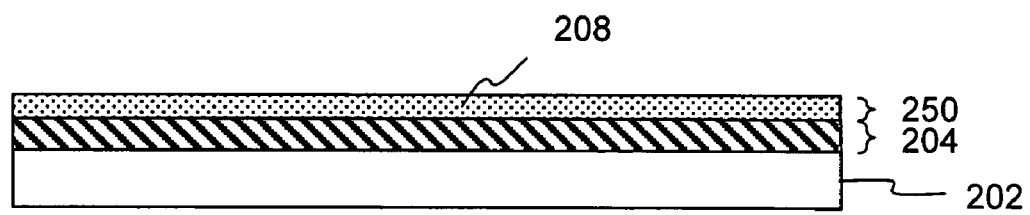
Figure 3C:
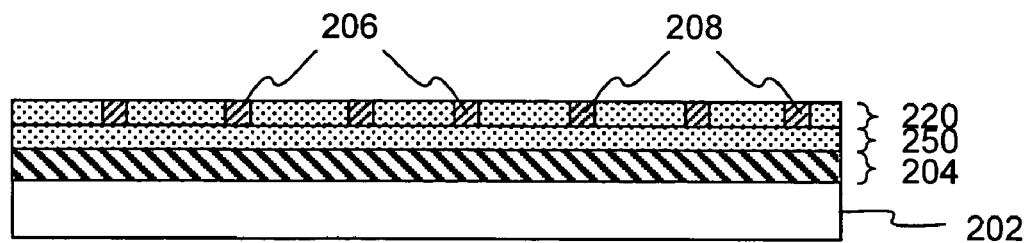
Figure 3D:
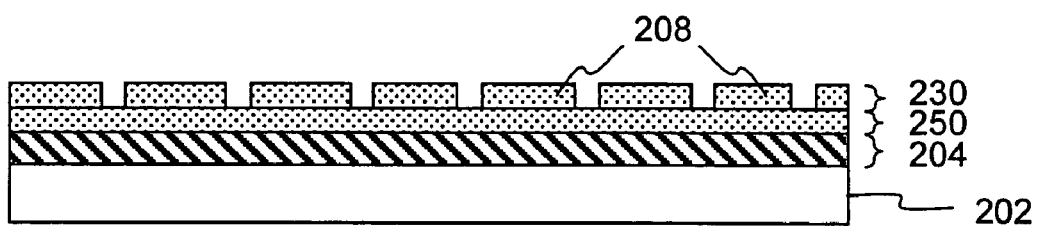
Figure 3E:
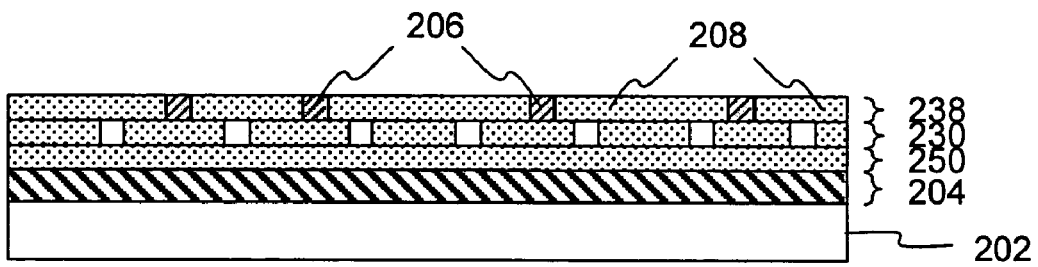
Figure 3F:
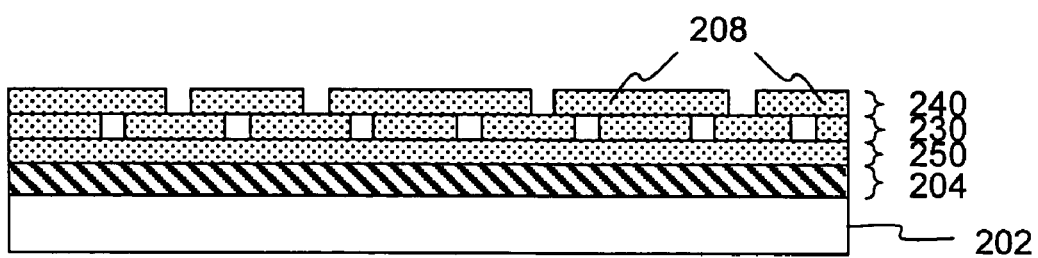
Figure 3G:
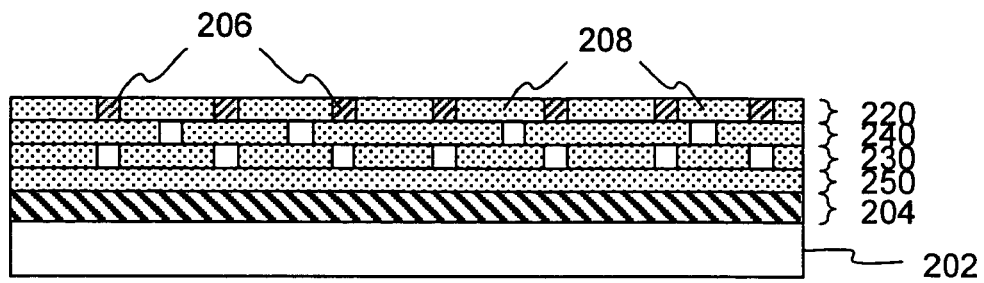
Figure 3H:
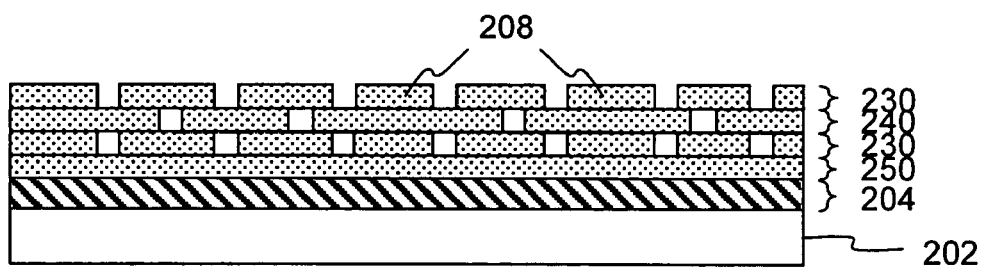
Figure 3I:
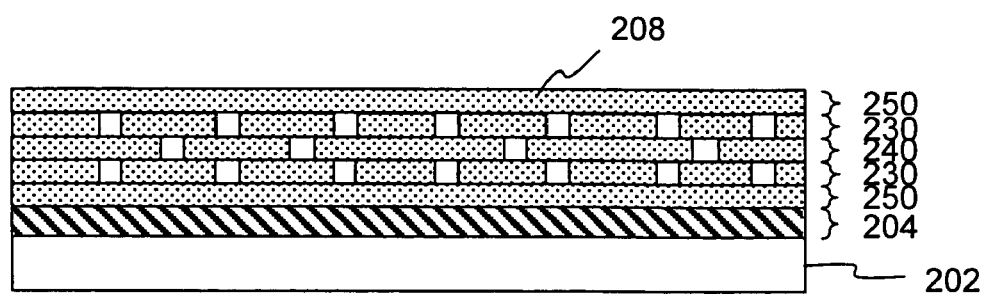

As shown in the flow diagram in FIG. 1, after each cycle, the process conditions can be reselected at step 114 to put down a different silica and silicon codeposit film. A different amount of silicon incorporated will alter the porosity of the layer. FIG. 3B and FIG. 3I show that a dense silica film 250 can be formed if so desired anywhere along the thickness of the porous film. In that case, no silicon incorporation is required in the codeposition step.

Since the porous film is formed completely in-situ, as another embodiment of this invention, any additional fabrication processing steps can be inserted before or after the cyclic process as desired. Like layer 250 illustrated in FIG. 3I, a similarly dense liner layer, cap layer, etch stop layer, or any other process layer can be deposited together with the porous film without breaking vacuum. This is particularly advantageous for process integration, for example, in the process of forming a dual damascene structure.

For this invention, there is no porogen to volatize post deposition. The porous silica matrix is chemically similar to dense silicon dioxide. The finely distributed pores provide good structural integrity and thermal stability. A broad range of low-k dielectrics can be obtained with this method.

Of essence in this invention are 1) the codeposition of silica (or the host matrix material in general) with silicon, 2) the exposure of the codeposit film to a selective silicon removal reagent during the selective silicon removal step, and 3) facilitation of the cyclic processing to modulate the codeposition and the selective silicon removal step.

The use of silicon as the sacrificial material to form the porous film is a critical aspect in this invention. The codeposition with silicon provides a silica template from which the porous structure develops. The selective silicon removal reagent enables the structure to be developed. There are certain chemical reagents well known to the silicon industry that can chemically react readily with silicon but not with many other materials. Hence, we can utilize these differential chemical reactivity properties to facilitate our selective silicon removal step.

For this invention, the selective silicon removal reagent is advantageously selected from a group of molecular halides or halogenated species comprising fluorine, chlorine, bromine and their derivatives thereof. The selective silicon removal reagent can also be selected from vapors derived from solutions containing potassium hydroxide, or tetramethylammonium hydroxide (TMAH), or ethylene diamine pyrocatecol (EDP), or their like or derivatives thereof, optionally mixed with a high vapor pressure carrier gas such as an alcohol that do not react with the vapor.

For this invention, the preferred selective silicon removal reagent is selected from a group consisting of molecular fluorine ($F_2$), xenon difluoride ($XeF_2$), and their combinations thereof.

Another important aspect of this invention is the facilitation of the cyclic processing to modulate the codeposition and the selective silicon removal step. Depending on the desired properties of the film, there are a number of ways to implement this invention. Those skilled in the arts understand alternative methods of deposition and numerous forms to practice the cyclic processing without departing from the spirit of this invention.

In a preferred embodiment of this invention, the codeposition is provided using plasma enhanced chemical vapor deposition techniques. A PECVD reactor with a radio frequency (RF) source at 13.56 MHz of a symmetric parallel plate configuration is used to produce plasma for deposition in a process chamber. The reagent stream comprises a codeposition reagent mixture and one or more selective silicon removal reagent. Intermittent RF power is used to regulate the codeposition and the selective silicon removal steps. The same reagent stream is supplied to the process chamber during both of these steps.

Figure 4:
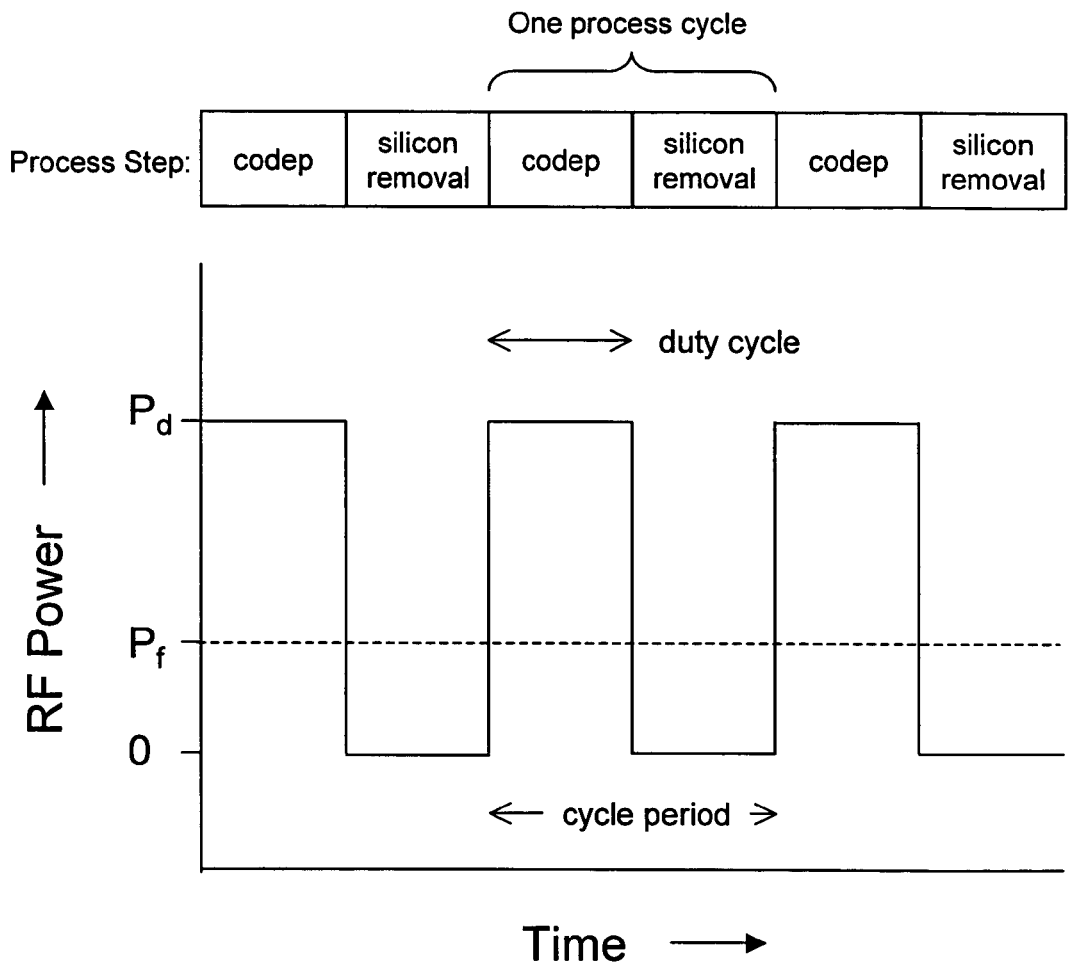
FIG. 4 is a schematic defining the process cycle frequency, cycle period, duty cycle, and illustrating the RF power level of an exemplary RF power delivery waveform.

FIG. 4 illustrates the important features in the RF power modulation control. For simplicity of illustration, the RF power waveform is represented as a rectangular pulse train in this diagram. In practice, other waveforms can also be used. The waveform is characterized by a cycle frequency, a cycle period, and a duty cycle. The cycle period is the duration of time for the completion of all the processing steps in one process cycle. The cycle frequency is the inverse of the cycle period, and the duty cycle is the proportion of time within the cycle period during which codeposition occurs.

In FIG. 4, we show the process cycle consists of the codeposition and the selective silicon removal steps. During codeposition, the RF power operates at $P_d$. At this power level, the RF power is high enough to dissociate the precursors for the codeposition of both silica and silicon. For the rest of the cycle, the RF power level is turned off or set to a low level such that deposition is discouraged. Not only must the power level be low enough so that the precursors for silica and silicon deposition cannot dissociate, but must also be below $P_f$, the power level that can dissociate the selective silicon removal reagent. FIG. 4 arbitrary depicts the waveform the power level set at zero during the selective silicon removal step.

To facilitate simultaneous PECVD silica and silicon formation, the codeposition reagent mixture must comprise at least one silicon-containing precursor and one oxygen-containing precursor. The selection of the precursors shall not be belabored here since those skilled in the arts of PECVD techniques understand various combinations of chemicals that are suitable. However, we will include the following codeposition mixture in the preferred process for this invention. The preferred codeposition mixture comprises silane ($SiH_4$), nitrous oxide ($N_2O$), with or without tetraethylorthosilicate (TEOS), with or without hydrogen ($H_2$), and argon (Ar) or other inert gas.

As is in the case of conventional silicon-rich PECVD silicon oxide, the silica-silicon codeposit will contain silica and some interstitial silicon atoms, silicon covalently bonded to each other, and silicon weakly bonded to hydrogen or hydroxyl groups or the like. When this codeposit is exposed to the selective silicon removal reagent, the reagent will chemically etch the silicon while the silica will remain virtually intact. The chemical reaction will proceed at a rate determined by the process temperature and the concentration of the selective silicon removal reagent in the process chamber.

In our preferred implementation, the same reagent mixture is continuously fed into the reaction chamber during the codeposition and the selective silicon removal steps. Accordingly, the codeposition reactions will occur in the presence of the selective silicon removal reagent. With RF power on, the selective silicon removal reagent will dissociate and participate in the plasma reactions. It may even be incorporated in the film. For example, if fluorine is used as the selective silicon removal reagent, some fluorinated oxide will also be formed during codeposition. (The fluorinated oxide will be beneficial for further lowering the dielectric constant of the silica). In addition, depending on the codeposition process conditions, these radicals will etch away some of the deposited silicon and oxide. In view of all these reactions, while a reasonable concentration of the selective silicon removal reagent must be present in the feed stream to facilitate the selective silicon removal at a reasonable rate, it is important to keep this concentration low relative to the codeposition conditions such that the net result is deposition during the codeposition step.

Besides the deposition and the silicon removal process conditions, the cycle frequency and the duty cycle also play a role in the development of the porous film. The duration of the selective silicon removal step is usually set long enough to remove some or all the silicon deposited in the same cycle. If too thick a layer is deposited in a cycle, then the silicon removal reagent will have to work through a thick codeposit to remove the silicon. It is not efficient, and sometimes it may not be effective even for a small molecule like fluorine, to diffuse far into a material to react. On the other hand, depositing a thin layer may not always be desirable either, especially if large silicon incorporation is desired to construct a high porosity film. Too thin a layer will result in a sparse silica matrix after the silicon removal. The codeposit in the next cycle may fill up the gaps. Thus, the process cycle frequency and the duty cycle must be set in relation to the codeposition and selective silicon removal rates such that a desired pore size and porosity profile of the film can be obtained.

As another embodiment, the cyclic method presented in this invention can be used to engineer porous silica or doped silica films with nanosize pores. The capability is illustrated in the following example. If silicon is codeposited at an apparent[1] rate of 400 Å/min and silica is codeposited at an apparent rate of 1000 Å/min, and if the process cycle frequency is 3 Hz with 50% duty cycle (i.e., the codeposition duration is 0.167 sec), then within each cycle, only a few angstroms of the codeposit is formed. Under such condition, the size of the dispersed silicon atoms will be on the same order as the thickness of the codeposit layer. This will give rise to dispersed openings of the same size when the silicon atoms are selectively removed. The codeposit formed in the next cycle will cover these openings and enclose the space beneath. The method will produce a film with advantageous nanosize pores. Thus, porous films with pore sizes ranging from 0.3 nm to 50 nm and porosity ranging from 0.5% to 90% can be obtained with this method.

[1] The apparent deposition rate can be calculated from the relative amount of silica and silicon deposited in the film within a given time interval. For example, the relative amount of silica and silicon in the codeposit layer can be estimated from the relative amount of silicon and oxygen in the deposit determined from SIMS (secondary ion mass spectroscopy) analysis and FTIR (Fourier Transform Infrared) absorption spectra.

In summary of the conditions to practice the PECVD process described above, we include the following further embodiments. The preferred reagent stream comprises silane, nitrous oxide, with or without tetraethylorthosilicate (TEOS), and with or without hydrogen or argon or other inert gas. The silane to nitrous oxide flow ratio is between 0.005 and 100. The feed stream also contains 0.1% to 50% molecular fluorine or xenon difluoride or their combinations thereof. During deposition, the PECVD chamber is maintained at a pressure between 0.01 torr and 15 torr with the electrode spacing between 0.1 inch and 3 inches, the substrate temperature between 25° C. and 500° C. and the RF power density between 0.01 W/cm$^2$ and 5 W/cm$^2$. The selective silicon removal step is performed at the same pressure and temperature as the codeposition step. The 13.56 MHz RF power is delivered at a process cycle frequency from 0.0005 Hz to 500 Hz with codeposition duty cycle ranging from 1% to 99%. For clarification, here the RF power density of a symmetric parallel plate reactor is defined as the RF power divided by two times the area of the cathode or anode.

More preferably, the PECVD process is conducted with a feed stream containing silane to nitrous oxide in a flow ratio from 0.01 to 30. The feed stream also contains 1% to 30% of molecular fluorine, xenon difluoride, or their combinations thereof. During deposition, the chamber pressure is maintained between 0.1 torr and 10 torr with the electrode spacing between 0.3 inch and 1.5 inches, substrate temperature held between 300° C. and 400° C., and RF power density between 0.2 W/cm$^2$ and 1.0 W/cm$^2$. The 13.56 MHz RF power is delivered at a process cycle frequency from 0.1 Hz to 10 Hz with codeposition duty cycle ranging from 5% to 70%.

Needless to say, this preferred implementation of the present invention could be practiced readily on a PECVD system equipped with RF power modulation control. If RF power modulation control is not available on the PECVD system, one can use a series of process recipe steps to simulate the RF power switching during the cyclic process. Alternatively, one can modify the RF power delivery hardware with a timing circuit or modify the system to provide a means such that the RF power delivered for deposition can intermittently be switched off or reduced to a low level as previously stated. As an option, the silicon removal reagent and the codeposition reagent mixture can be introduced together as a single reagent feed stream for the codeposition and the silicon removal steps.

Another way to implement the present invention on a conventional PECVD reactor is to run the codeposition and the selective silicon removal steps separately as two independent process programs. These two processes will be performed alternately in the same chamber to simulate the cyclic processing. While the codeposition is performed as a conventional PECVD process, no RF power is applied during the selective silicon removal step. The codeposition reagents and the selective silicon removal reagents can be supplied separately during their respective processes.

Alternatively, in chamber designs that have multiple stages for sequential processing [see for example, U.S. Pat. No. 6,007,675], another way to implement the present invention is to transfer the substrate to a separate stage in the same reactor after the codeposition step. RF power is applied only to the stage that is undergoing codeposition. In this scenario, at least two wafers, one undergoing codeposition and one undergoing selective silicon removal, will be processed together at the same time in the same reactor with the same feed stream but on different stages.

Still another way to implement the present invention is to conduct the codeposition and the selective silicon removal steps in separate reaction chambers in a cluster tool. The substrate is transferred between two chambers so that it receives sequential processing of codeposition and selective silicon removal.

With isolated chamber processing, any deposition methodology that can form the codeposit can be used to practice the cyclic process of the present invention. Some methodologies may be physical vapor deposition, thermal chemical vapor deposition, spin coating and others. In fact, the implementation can be extended to any setup so long as a silica-silicon codeposit is formed and the codeposit is exposed to an ambient containing the selective silicon removal reagent to remove the silicon. The same process sequence can be repeated as desired to develop the thickness of the porous film.

In all these foregoing implementations, it is important to note that they are not all equivalent in allowing the same range of process cycle frequency and duty cycle to be performed. Therefore, the applicability of each implementation depends on the particular process chemistry and process conditions desirably selected. We believe using RF amplitude modulation in a PECVD configuration provides the most flexible means with stable controls of the codeposition and the selective silicon removal environment for efficient practice of this invention.

Finally, the description presented herein does not distinguish the method for formation of a porous silica film or formation of a porous doped silica films such as porous fluorine-doped silica (FSG), porous carbon-doped silica, porous phosphorous-doped silica (PSG), porous hydrogen silsesquioxane (HSQ), porous methyl silsesquioxane (MSQ), porous boron-doped silica (BSG), porous boron-phosphorus-doped silica (BPSG), or the like. In fact, it does not distinguish the method for formation of other porous films such as porous silicon nitride, porous silicon oxynitride, porous silicon carbide, porous boron nitride, porous boron oxynitride, porous aluminum oxide, porous aluminum nitride, porous aluminum oxynitride, or the like. To reiterate, salient in this invention are the codeposition with silicon and the selective removal of the sacrificial silicon. Hence, the scope of this invention covers not only formation of porous silica films, but also other porous films of host matrix materials, inorganic or organic or a combination thereof, that are relatively inert to the selective silicon removal reagent. Even if some of the constituent film materials react with the selective silicon removal reagent, as long as a porous film is formed, the practice is within the scope of the present invention.

As an example, a porous carbon-doped silica film can be formed with the present invention by codepositing carbon-containing species in the silica-silicon film. The use of selective silicon removal reagent like fluorine will attack some of the carbon in the film to form fluorocarbon species during the silicon removal step. Depending on the film constituents and the process conditions, the reaction products may be volatile and can be removed together with the silicon fluorides or they may be non-volatile and leave behind a fluorocarbon component in the film. (Note that C—F bonds are beneficial for providing hydrophobic property of the film). The desirability of the film is to be determined, but as long as the essential features of silicon codeposition and selective silicon removal is followed to form the porous film, the practice fall within the scope of this invention.

Figure 5:
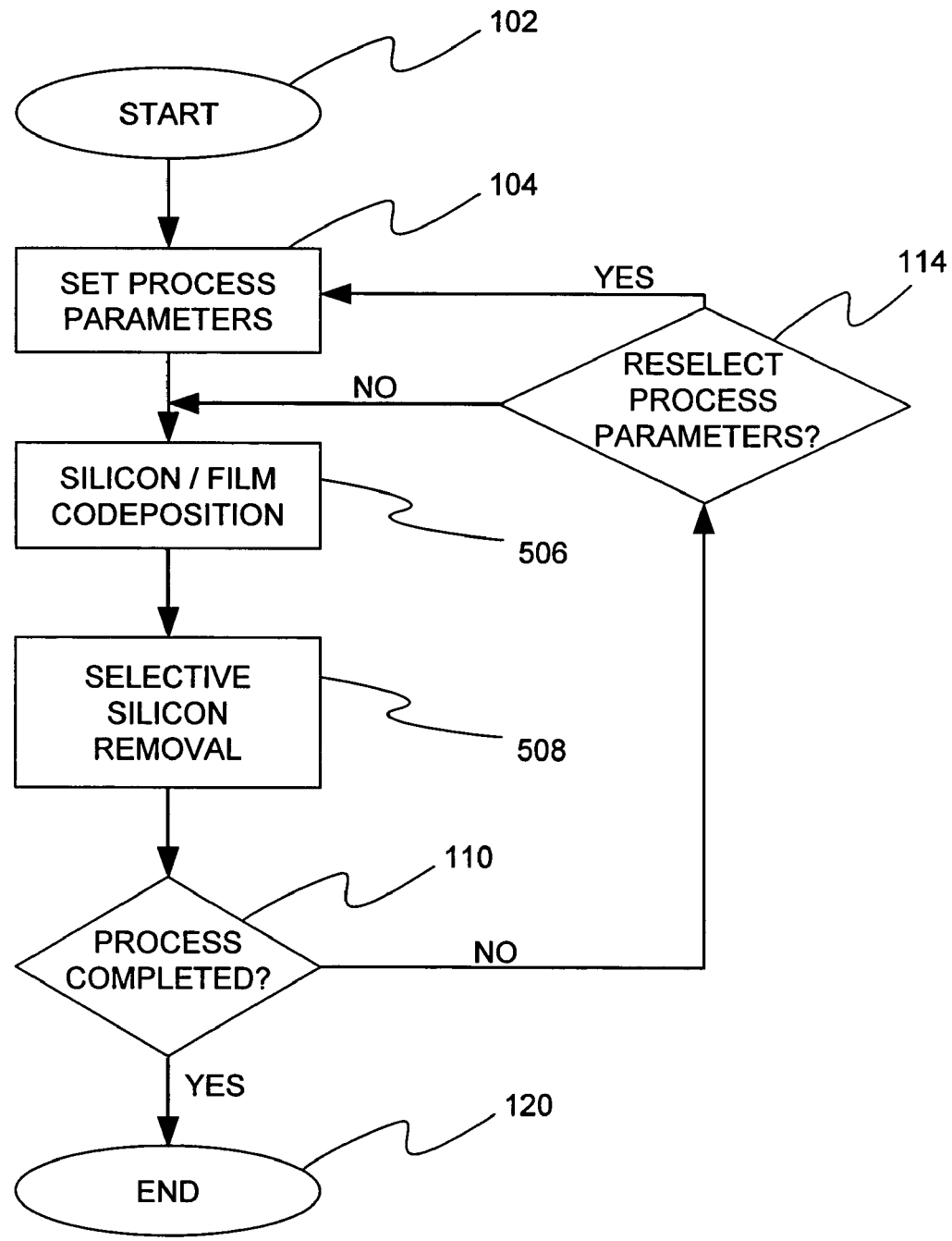
FIG. 5 is a flow diagram illustrating a generic cyclic process scheme for forming other porous films based on repeating alternating steps of silicon codeposition with the film material followed by selective silicon removal. This generic process is claimed as a broader scope of this invention.

Henceforth, in FIG. 5, we present further a generic flow diagram for the formation of porous films using the basic concept of this invention. Similar to the process flow shown in FIG. 1, but instead of step 106, the codeposition incorporates all the constituent film materials and silicon in step 506. In step 508, the selective silicon removal reagent removes silicon from the codeposit. Other constituents in the film may also react with the selective silicon removal reagent but the constituents that make up the desired host matrix material should remain relatively inert to the selective silicon removal reagent. The same embodiments that apply to the silica films apply to these cases.

In summary, the present invention can be practiced to provide porous silica and doped silica films with a broad range of low dielectric constants for semiconductor integrated circuit fabrication. The same cyclic processing method can be extended more generally to provide other porous films using silicon as the sacrificial material and using at least one of the selective silicon removal reagents to remove the silicon to form the porous film. The method is advantageous for use in many applications including and not limiting to semiconductor, advanced packaging, energy storage, and advanced Microsystems.

While the above description is directed to the embodiments of the present invention, other and further embodiments of the invention may be devised without departing from the basic scope thereof. For example, the use of a plasma generated from low RF frequency in the kilohertz range or from frequency range in the megahertz other than 13.56 MHz, the use of mixed frequency RF power, or different ways of generating the plasma, whether capacitively or inductively coupled, or decoupled, should all be regarded as different adaptations of the same PECVD implementation embodied in this invention. It is further to be noted that variations of the cyclic process, such as addition of any pre- and post-deposition treatment comprising plasma, electron beam, ion beam, ultraviolet, chemical, or thermal processing steps to activate the exposed film surfaces or modify the film properties do not depart from the spirit of this invention. The deposition of additional materials to enhance the film properties or assist the silicon removal reaction also does not depart from the spirit of this invention.

We claim:

1. A method based on plasma enhanced chemical vapor deposition techniques for depositing a porous film of a host matrix material on a substrate in a vacuum environment, comprising:
   (a) Using a reagent mixture stream that comprises at least one silicon-containing precursor, at least one selective silicon removal reagent, and other additional chemical reagents known to those skilled in the arts for facilitating the PECVD of the film host matrix material and the PECVD of silicon;
   (b) Using RE power modulation to facilitate the execution of a plurality of processing cycles to form the desired thickness of the porous film, wherein each cycle comprises codeposition of the host matrix material with silicon when the RF power level is set at a level suitable for the codeposition of the film host matrix material and silicon, and selective removal of silicon from the codeposit to form the porous structure by chemical exposure of the codeposit to the reagent mixture containing the selective silicon removal reagent when the RF power level is turned off or set below that which is required for deposition or the dissociation of the selective silicon removal reagent;
   wherein the selective silicon removal reagent is a vapor derived from a solution containing at least a chemical selected from the group consisting of potassium hydroxide, tetramethylammonium hydroxide (TMAH), ethylene diamine pyrocatecol (EDP), and their derivatives thereof.

2. The method of claim 1 wherein the film host matrix material is an inorganic or an organic material or a combination thereof.

3. The method of claim 1 wherein the film host matrix material is a member of the group consisting of silica, carbon-doped silica, fluorine-doped silica (FSG), boron-doped silica (BSG), phosphorus-doped silica (PSG), boron-phosphorus-doped silica (BPSG), germanium-doped silica (GSG), hydrogen silsesquioxane (HSQ), methyl silsesquioxane (MSQ), silicon nitride, silicon oxynitride, silicon carbide, aluminum oxide, aluminum nitride, aluminum oxynitride, boron nitride, boron oxynitride, and combinations thereof.

4. The method of claim 1 wherein the PECVD conditions comprise RF excitation frequency ranging from 100 kHz to 100 MHz in a single frequency mode, preferably at 13.56 MHz.

5. The method of claim 1 wherein the PECVD conditions comprise RF excitation frequency ranging from 100 kHz to 100 MHz in a mixed frequency mode.

6. The method of claim 1 carried out in a PECVD system equipped with RF power modulation capability.

7. The method of claim 1 carried out in a PECVD system modified to provide a means to enable control of RF power level change to facilitate cyclic execution of the codeposition step, which requires RF power, and the selective silicon removal step, which does not require RF power but can accommodate a level of RF power below that is required for the dissociation of the selective silicon removal reagent.

8. The method of claim 1 wherein the RF power is delivered at a process cycle frequency from 0.0005 Hz to 500 Hz with codeposition duty cycle ranging from 1% to 99%, preferably at a process cycle frequency from 0.1 Hz to 10 Hz with codeposition duty cycle ranging from 5% to 70%.

9. The method of claim 1 wherein the codeposition RF power density is between 0.01 $W/cm^2$ and 5 $W/cm^2$ preferably between 0.2 $W/cm^2$ and 1.0 $W/cm^2$.

10. The method of claim 1 wherein the process is performed with electrode spacing held between 0.1 inch and 3 inches, preferably between 0.3 inch and 1.5 inches.

11. The method of claim 1 wherein the process is performed with the substrate temperature held between 25° C. and 500° C., preferably between 300° C. and 400° C.

12. The method of claim 1 wherein the process is performed with the chamber pressure maintained between 0.01 torr and 15 torr, preferably between 0.1 torr and 10 torr.

13. The method of claim 1 wherein the concentration of the selective silicon removal reagent in the reagent mixture is between 0.1% and 50%.

14. The method of claim 1 wherein the reagent mixture comprises molecular fluorine in a concentration between 1% and 30%.

15. The method of claim 1 for making a porous film with a desired porosity profile by individually selecting the processing conditions (including temperature, pressure, electrode spacing, deposition RF power, process cycle frequency, process cycle period and duty cycle) for some of the codeposition and selective silicon removal steps.

16. The method of claim 1 for making a porous film with pore sizes ranging from 0.3 nm to 50 nm.

17. The method of claim 1 for making a porous film with porosity from 0.5% to 90%.

18. The method of claim 1 further comprises at least one additional treatment step performed at selected cycle interval of the process, wherein the treatment step is selected from the group comprising plasma, electron beam, ion beam, electromagnetic radiation, chemical, or thermal exposure.

19. The method of claim 1 further comprises depositing a liner layer on the substrate prior to depositing the porous film without breaking vacuum.

20. The method of claim 1 further comprises depositing on top of the porous film a capping layer without breaking vacuum.

21. The method of claim 1 further comprises depositing on top of the porous film a low k etch stop layer without breaking vacuum.

22. The method of claim 1 wherein the reagent mixture comprises silane and nitrous oxide in the flow ratio between 0.005 to 100, preferably between 0.01 to 30.

23. The method of claim 22 wherein the reagent mixture further comprises argon.

24. The method of claim 22 wherein the reagent mixture further comprises hydrogen.

25. A method based on plasma enhanced chemical vapor deposition techniques for depositing a porous film of a host matrix material on a substrate in a vacuum environment, comprising:
    (a) Using a reagent mixture stream that comprises at least one silicon-containing precursor, at least one selective silicon removal reagent, and other additional chemical reagents known to those skilled in the arts for facilitating the PECVD of the film host matrix material and the PECVD of silicon;
    (b) Using RF power modulation to facilitate the execution of a plurality of processing cycles to form the desired thickness of the porous film, wherein each cycle comprises codeposition of the host matrix material with silicon when the RF power level is set at a level suitable for the codeposition of the film host matrix material and silicon, and selective removal of silicon from the codeposit to form the porous structure by chemical exposure of the codeposit to the reagent mixture containing the selective silicon removal reagent when the RF power level is turned off or set below that which is required for deposition or the dissociation of the selective silicon removal reagent;
    wherein the selective silicon removal reagent is a vapor derived from a solution containing at least a chemical selected from the group consisting of potassium hydroxide, tetramethylammonium hydroxide (TMAH), ethylene diamine pyrocatecol (EDP), and their derivatives thereof; and
    wherein the vapor is further mixed with a high vapor pressure carrier gas that is chemically inert to the selective silicon removal reagent.

26. A method for depositing a porous film of a host matrix material on a substrate in a vacuum environment, comprising a plurality of processing cycles, wherein each cycle comprises:
    (a) codepositing the host matrix material with silicon by plasma enhanced chemical vapor deposition in a PECVD process chamber using a codeposition reagent mixture stream that comprises at least one silicon-containing precursor and other additional chemical reagents known to those skilled in the arts for facilitating the PECVD of the film host matrix material and the PECVD of silicon;
    (b) in a subsequent step, exposing the codeposit to a reagent stream that comprises a selective silicon removal reagent so that silicon is preferentially removed from the codeposit by the chemical actions of the selective silicon removal reagent, leaving behind a porous structure of the host matrix material;
    whereby repeated execution of the codeposition and selective silicon removal steps build up the thickness of the porous film.

27. The method of claim 26 wherein the film host matrix material is an inorganic or an organic material or a combination thereof.

28. The method of claim 26 wherein the film host matrix material is a member of the group consisting of silica, carbon-doped silica, fluorine-doped silica (FSG), boron-doped silica (BSG), phosphorus-doped silica (PSG), boron-phosphorus-doped silica (BPSG), germanium-doped silica (GSG), hydrogen silsesquioxane (HSQ), methyl silsesquioxane (MSQ), silicon nitride, silicon oxynitride, silicon carbide, aluminum oxide, aluminum nitride, aluminum oxynitride, boron nitride, boron oxynitride, and combinations thereof.

29. The method of claim 26 wherein the selective silicon removal reagent is selected from a group consisting of molecular halides and halogenated species comprising fluorine, chlorine, bromine, and their derivatives thereof.

30. The method of claim 26 wherein the selective silicon removal reagent is selected from the group consisting of molecular fluorine, xenon difluoride, and their combinations thereof.

31. The method of claim 26 wherein the PECVD conditions comprise RF excitation frequency ranging from 100 kHz to 100 MHz in a single frequency mode, preferably at 13.56 MHz.

32. The method of claim 26 wherein the PECVD conditions comprise RF excitation frequency ranging from 100 kHz to 100 MHz in a mixed frequency mode.

33. The method of claim 26 wherein the codeposition and the selective silicon removal steps are carried out in separate process chambers in the same cluster tool.

34. The method of claim 26 wherein the codeposition and the selective silicon removal steps are carried out in the same process chamber.

35. The method of claim 26 carried out in a PECVD system using recipe programs, including a series of processing steps in recipe programs, to facilitate cyclic execution of the codeposition and the selective silicon removal steps.

36. The method of claim 26 carried out on separate stages of a multistage reactor wherein the codeposition step is conducted on one stage by PECVD with RF power, and the selective silicon removal step on a different stage without RF power.

37. The method of claim 26 wherein the selective silicon removal step is performed at a temperature between 25° C. and 500° C., preferably between 300° C. and 400° C.

38. The method of claim 26 wherein the selective silicon removal step is performed at chamber pressure maintained between 0.01 and 700 torr, preferably between 0.1 torr to 10 torr.

39. The method of claim 26 wherein the codeposition step is performed with the substrate temperature between 25° C. and 500° C., preferably between 300° C. and 400° C.

40. The method of claim 26 wherein the codeposition step is performed with the chamber pressure maintained in the range between 0.01 torr and 15 torr, preferably between 0.1 torr and 10 torr.

41. The method of claim 26 wherein the codeposition step is performed with electrode spacing held between 0.1 and 3 inches, preferably between 0.3 and 1.5 inches.

42. The method of claim 26 wherein the concentration of the selective silicon removal reagent in the process chamber is between 0.1% and 100%.

43. The method of claim 26 wherein the reagent stream for the selective silicon removal step comprises molecular fluorine in a concentration between 0.1% and 100%.

44. The method of claim 26 for making a porous film with a desired porosity profile by individually selecting the processing conditions (including temperature, pressure, electrode spacing, and deposition RF power) for some of the codeposition and selective silicon removal steps.

45. The method of claim 26 for making a porous film with pore sizes ranging from 0.3 nm to 50 nm.

46. The method of claim 26 for making a porous film with porosity from 0.5% to 90%.

47. The method of claim 26 further comprises at least one additional treatment step performed at selected cycle interval, wherein the treatment step is selected from the group comprising plasma, electron beam, ion beam, electromagnetic radiation, chemical, or thermal exposure.

48. The method of claim 26 further comprises depositing a liner layer on the substrate prior to depositing the porous film without breaking vacuum.

49. The method of claim 26 further comprises depositing on top of the porous film a capping layer without breaking vacuum.

50. The method of claim 26 further comprises depositing on top of the porous film a low k etch stop layer without breaking vacuum.

51. The method of claim 26 wherein the selective silicon removal step is a vapor derived from a solution containing at least a chemical selected from the group consisting of potassium hydroxide, tetramethylammonium hydroxide (TMAH), ethylene diamine pyrocatecol (EDP), and their derivatives thereof.

52. The method of claim 51 wherein the vapor is further mixed with a high vapor pressure carrier gas that is chemically inert to the selective silicon removal reagent.

53. The method of claim 26 wherein the codeposition step is performed with the RF power density between 0.01 and 5 W/cm$^2$, preferably between 0.2 and 1.0 W/cm$^2$.

54. The method of claim 26 wherein the reagent stream for the codeposition step comprises silane and nitrous oxide in a flow ratio between 0.005 and 100, preferably between 0.01 and 30.

55. The method of claim 54 wherein the reagent stream for the codeposition step further comprises argon.

56. The method of claim 54 wherein the reagent stream for the codeposition step further comprises hydrogen.

57. A method for depositing a porous film of a host matrix material on a substrate, comprising a plurality of processing cycles, wherein each cycle comprises:
    (a) Codepositing the host matrix material with silicon in one step;
    (b) In a subsequent step, exposing the codeposit to a reagent stream that comprises at least a selective silicon removal reagent so that silicon is preferentially removed from the codeposit by the chemical actions of the selective silicon removal reagent, leaving behind a porous structure of the host matrix material;
    whereby repeated execution of the codeposition and selective silicon removal steps build up the thickness of the porous film.

58. The method of claim 57 wherein the codeposition step is conducted with a deposition technique selected from the group comprising spin coating, thermal chemical vapor deposition, physical vapor deposition, and deposition techniques assisted by electromagnetic energy ranging from radio frequency to microwave spectrum.

59. The method of claim 57 wherein the film host matrix material is an inorganic or an organic material or a combination thereof.

60. The method of claim 57 wherein the film host matrix material is a member of the group consisting of silica, carbon-doped silica, fluorine-doped silica (FSG), boron-doped silica (BSG), phosphorus-doped silica (PSG), boron-phosphorus-doped silica (BPSG), germanium-doped silica (GSG), hydrogen silsesquioxane (HSQ), methyl silsesquioxane (MSQ), silicon nitride, silicon oxynitride, silicon carbide, aluminum oxide, aluminum nitride, aluminum oxynitride, boron nitride, boron oxynitride, and combinations thereof.

61. The method of claim 57 wherein the selective silicon removal reagent is selected from a group consisting of molecular halides and halogenated species comprising fluorine, chlorine, bromine, and their derivatives thereof.

62. The method of claim 57 wherein the selective silicon removal reagent is selected from the group consisting of molecular fluorine, xenon difluoride, and their combinations thereof.

63. The method of claim 57 wherein the codeposition and the selective silicon removal steps are carried out in separate process chambers in the same cluster tool.

64. The method of claim 57 wherein the selective silicon removal step is performed at a temperature between 25° C. and 500° C., preferably between 300° C. and 400° C.

65. The method of claim 57 wherein the selective silicon removal step is performed at chamber pressure maintained between 0.01 torr and 700 torr, preferably between 0.1 torr and 10 torr.

66. The method of claim 57 wherein the concentration of the selective silicon removal reagent in the reagent stream is between 0.1% and 100%.

67. The method of claim 57 wherein the reagent stream for the selective silicon removal step comprises molecular fluorine in a concentration between 0.1% and 100%.

68. The method of claim 57 for making a porous film with a desired porosity profile by individually selecting the processing conditions in some of the codeposition and selective silicon removal steps.

69. The method of claim 57 for making a porous film with pore sizes ranging from 0.3 nm to 50 nm.

70. The method of claim 57 for making a porous film with porosity from 0.5% to 90%.

71. The method of claim 57 further comprises at least one additional treatment step performed at selected cycle interval, wherein the treatment step is selected from the group comprising plasma, electron beam, ion beam, electromagnetic radiation, chemical, or thermal exposure.

72. The method of claim 57 further comprises depositing a liner layer on the substrate prior to depositing the porous film without breaking vacuum.

73. The method of claim 57 further comprises depositing on top of the porous film a capping layer without breaking vacuum.

74. The method of claim 57 further comprises depositing on top of the porous film a low k etch stop layer without breaking vacuum.

75. The method of claim 57 wherein the selective silicon removal reagent is a vapor derived from a solution containing at least a chemical selected from the group consisting of potassium hydroxide, tetramethylammonium hydroxide (TMAH), ethylene diamine pyrocatecol (EDP), and their derivatives thereof.

76. The method of claim 75 wherein the vapor is further mixed with a high vapor pressure carrier gas that is chemically inert to the selective silicon removal reagent.

* * * * *